(12) United States Patent
Sasaki

(10) Patent No.: US 8,323,860 B2
(45) Date of Patent: Dec. 4, 2012

(54) SOLID-STATE IMAGING DEVICE PRODUCING METHOD AND EXPOSURE MASK

(75) Inventor: Shu Sasaki, Iwate-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 353 days.

(21) Appl. No.: 12/796,065

(22) Filed: Jun. 8, 2010

(65) Prior Publication Data

US 2010/0316941 A1    Dec. 16, 2010

(30) Foreign Application Priority Data

Jun. 10, 2009  (JP) .................................. 2009-139091

(51) Int. Cl.
*H01L 21/027* (2006.01)
*G03F 9/00* (2006.01)

(52) U.S. Cl. .......... 430/22; 430/314; 430/319; 430/321; 438/144; 438/514

(58) Field of Classification Search .................... None
See application file for complete search history.

(56) References Cited

U.S. PATENT DOCUMENTS

| 2002/0051914 A1* | 5/2002 | Chang ............................. 430/22 |
| 2008/0213936 A1* | 9/2008 | Hatai ............................. 438/60 |
| 2009/0181501 A1 | 7/2009 | Sekine et al. |

FOREIGN PATENT DOCUMENTS

| JP | 2007-194497 | * 8/2007 |
| JP | 4108662 | 4/2008 |

OTHER PUBLICATIONS

Computer-generated translation of JP 2007-194497 (Aug. 2007).*

* cited by examiner

*Primary Examiner* — John A. McPherson
(74) *Attorney, Agent, or Firm* — Oblon, Spivak, McClelland, Maier & Neustadt, L.L.P.

(57) ABSTRACT

A solid-state imaging device producing method includes the steps of: applying a resist material onto a substrate in which a channel region is formed; forming a resist layer by exposure and development of the resist material using a mask, the resist layer having an opening and a thin-film portion, the mask having a first region through which light is transmitted and a second region through which a smaller quantity of light than that the light transmitted through the first region is transmitted; subjecting the substrate to ion implantation using the resist layer as a mask to form an impurity region; etching the substrate using the resist layer as a mask after the ion implantation to form an alignment mark; and forming an electrode on the impurity region and part of the channel region using the alignment mark as a reference.

12 Claims, 6 Drawing Sheets

SOLID-STATE IMAGING DEVICE PRODUCING METHOD AND EXPOSURE MASK

CROSS REFERENCE TO RELATED APPLICATIONS

This application is based upon and claims the benefit of priority from the prior Japanese Patent Application No. 2009-139091 filed in Japan on Jun. 10, 2009; the entire contents of which are incorporated herein by reference.

FIELD

Embodiments described herein relate generally to a solid-state imaging device producing method, and to an exposure mask.

BACKGROUND

A solid-state imaging device that is widely used in a video camera, a digital camera, and the like includes a pixel portion that includes a plurality of photodiodes formed into a lattice shape on a semiconductor substrate, a vertical transfer register that is connected to the pixel portion, and a horizontal transfer register that is connected to the vertical transfer register.

In the solid-state imaging device, a photodiode converts received light into electron. The electrons as a result of the conversion are sequentially transferred by the vertical transfer register and the horizontal transfer register, and finally a desired image is output by performing charge-voltage conversion.

The vertical transfer register or the horizontal transfer register of the solid-state imaging device has the following configuration.

For example, an n-type channel region is formed in a surface of a p-type silicon substrate. In a surface of the channel region, a plurality of p-type transfer barrier portions are provided in a row with a space between one another by ion implantation of boron or the like. A plurality of transfer electrodes are formed in a row with a space between one another on the silicon substrate in which the channel region and the transfer barrier portions are formed, and an insulating film is interposed between the transfer electrodes and the silicon substrate. Each of the transfer electrodes is formed in a region extending from one end of the transfer barrier portion over the transfer barrier portion toward a charge transfer direction to the channel region.

The solid-state imaging device transfers the charge by alternately applying a voltage to the transfer electrodes formed in a row to control a potential in the silicon substrate.

In producing the solid-state imaging device, after the transfer barrier portions are formed by subjecting the surface of the channel region to ion implantation, the transfer electrodes are formed by, for example, a lift-off method. However, the transfer barrier portions cannot be visually recognized even if they are formed. Accordingly, it is difficult to overlay the transfer electrodes on the transfer barrier portions.

In this regard, conventionally in producing a solid-state imaging device, an alignment mark that serves as a reference for alignment is formed by etching outside a device region on the silicon substrate, and then the above-described process is performed using the alignment mark as a reference.

As another producing method of the solid-state imaging device, there is known a method for forming the transfer barrier portions and the alignment mark through a single resist layer. In the method, first a resist layer is formed on a silicon substrate. The resist layer has an opening for forming an alignment mark and thin-film portions for forming transfer barrier portions. Then, the silicon substrate is subjected to dry etching through the resist layer, thereby forming the alignment mark. Next, the ion implantation is performed through the resist layer.

According to the method, because the alignment mark and the transfer barrier portions are formed using the single resist layer, the process of forming only the alignment mark can be eliminated. In addition, because the resist layer for forming the transfer electrodes can directly be aligned with the alignment mark as a reference, the transfer electrodes can accurately be formed in desired positions.

However, in the method, because the dry etching is performed first to form the alignment mark, the thin-film portions of the resist layer are also etched by the dry etching. Therefore, in the subsequent ion implantation process, the ion implantation is performed through the thin-film portions having a thickness smaller than a designed thickness. Therefore, it is disadvantageously difficult to form the transfer barrier portions to have a given depth with high accuracy.

DETAILED DESCRIPTION

A solid-state imaging device produced by a producing method according to an embodiment of the invention will be described in detail with reference to the drawings. A horizontal transfer register of a solid-state imaging device will be described below.

Figure 1:
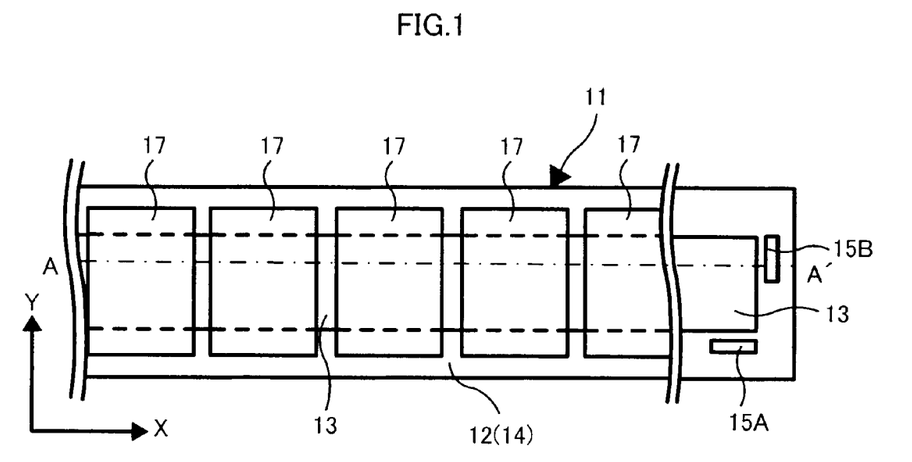
FIG. 1 is a plan view illustrating a solid-state imaging device produced by a solid-state imaging device producing method according to an embodiment of the invention.
Figure 2:
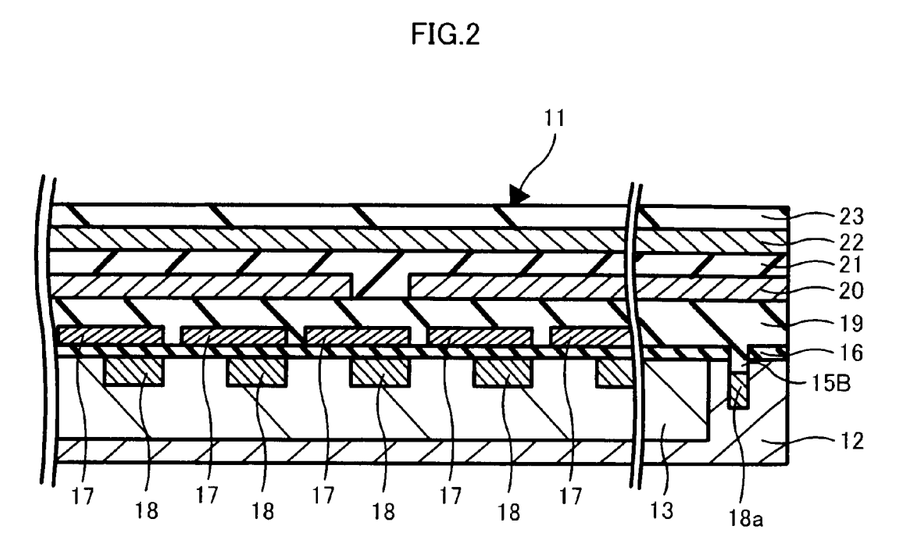
FIG. 2 is a sectional view of the device taken along a dashed and dotted line A-A' of FIG. 1.

FIG. 1 is a plan view illustrating a main part of a horizontal transfer register 11 of a solid-state imaging device produced according to the producing method of the embodiment. FIG. 2 is a sectional view of the horizontal transfer register 11 taken along a dashed and dotted line A-A' of FIG. 1.

As illustrated in FIG. 1, in the horizontal transfer register 11, a channel region 13 that is an n-type impurity layer is buried in a surface of a p-type silicon (Si) substrate 12. The channel region 13 is formed into a belt shape along a row in a horizontal direction of photodiodes (not illustrated) that are arrayed into a lattice shape on the p-type silicon substrate 12.

The n-type channel region 13 is surrounded by the p-type silicon (Si) substrate 12. Accordingly, a potential barrier is formed in a boundary portion between the n-type channel region 13 and the p-type silicon substrate 12. As a result of the formation of such potential barrier, charges transferred from the photodiodes (not illustrated) into the n-type channel region 13 do not diffuse in the surrounding p-type silicon substrate 12 but are transferred within the n-type channel region 13. That is, the p-type silicon substrate 12 surrounding the n-type channel region 13 acts as a channel stop region 14.

In the following description, a longitudinal direction of the channel region 13 is referred to an X-direction and a direction perpendicular to the X-direction is referred to as a Y-direction, as illustrated in FIG. 1.

In the silicon substrate 12 near an end portion of the channel region 13, alignment marks 15A and 15B are formed into a recess shape by etching a surface of the silicon substrate 12. The alignment mark 15A is formed into a rectangular shape near the channel region 13 along the X-direction. The alignment mark 15A serves as a reference for alignment in the X-direction in forming transfer electrodes 17 illustrated in FIG. 2.

The alignment mark 15B is formed into a rectangular shape near the channel region 13 along the Y-direction. The alignment mark 15B serves as a reference for alignment in the Y-direction in forming the transfer electrodes 17 illustrated in FIG. 2.

As illustrated in FIG. 2, a first oxide film 16 is formed on the surface of the silicon substrate 12, in which the channel region 13 and the alignment marks 15A and 15B are formed, except on the portion in which the alignment marks 15A and 15B are formed.

On the first oxide film 16 illustrated in FIG. 2, a plurality of transfer electrodes 17 are formed with a space between one another. For example, each transfer electrode 17 is made of polysilicon and has a rectangular shape. As illustrated in FIG. 1, the transfer electrodes 17 are formed so as to traverse the channel region 13. That is, each transfer electrode 17 is formed so as to include a region above the channel region 13 and to reach a part of a region above the silicon substrate 12.

As illustrated in FIG. 2, a plurality of transfer barrier portions 18 that are a plurality of p-type impurity layers are formed in the surface of the channel region 13. Each of the transfer barrier portions 18 is formed to have a given depth in a portion below the transfer electrode 17. That is, each of the transfer barrier portions 18 is formed in a position in which one side surface of the transfer barrier portion 18 is aligned with one side surface of the transfer electrode 17 such that the length of the transfer barrier portion 18 is shorter than the length of the transfer electrode 17. Therefore, the transfer barrier portions 18 are formed at constant intervals with a space between one another.

A p-type impurity layer 18a that is formed by the same process as the p-type transfer barrier portion 18 is formed immediately below the alignment mark 15B. Although not illustrated, the p-type impurity layer 18a is also formed immediately below the alignment mark 15A.

In the actual solid-state imaging device, a vertical transfer register is formed between the horizontal transfer register and a pixel portion including the photodiodes in order to transfer the charge generated by the photodiodes to the horizontal transfer register 11. Accordingly, the transfer barrier portions 18 described above are actually formed in contact with an impurity region constituting the vertical transfer register (not illustrated).

A second oxide film 19 is formed on the first oxide film 16 including the transfer electrodes 17. A first interconnection layer 20 is formed on the second oxide film 19. A third oxide film 21 is formed on the second oxide film 19 including the first interconnection layer 20. A second interconnection layer 22 is formed on the third oxide film 21. A passivation film 23 that is a surface protective layer is formed on the second interconnection layer 22.

Although not illustrated, a part of an interconnection formed in the first interconnection layer 20 or a part of an interconnection formed in the second interconnection layer 22 is electrically connected to the transfer electrode 17. A voltage can be applied to the transfer electrode 17 through the interconnection connected to the transfer electrode 17.

Figure 3:
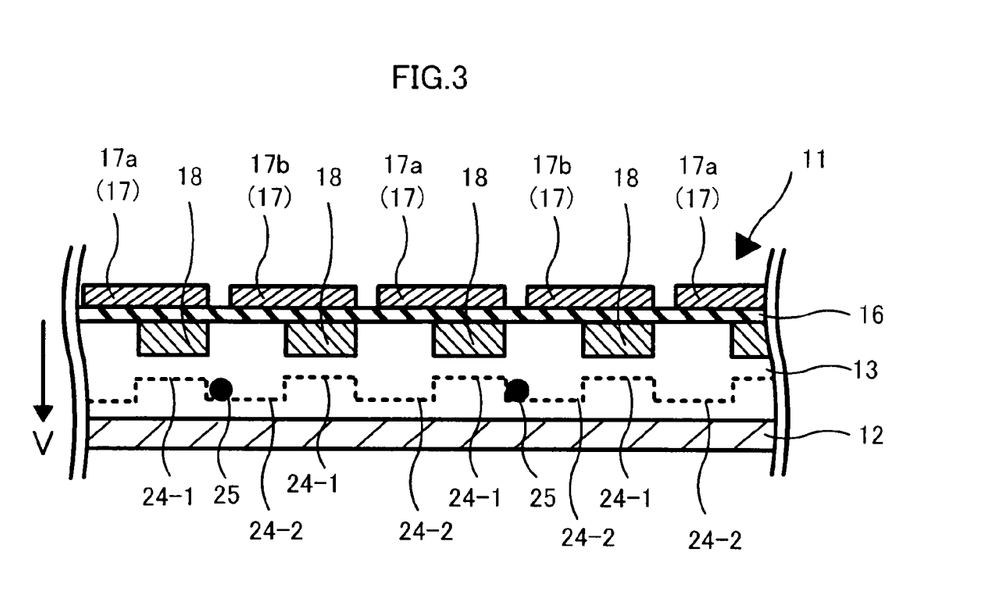
FIG. 3 illustrates potentials formed by a channel layer and a transfer barrier portion when a voltage is not applied to the solid-state imaging device of FIG. 2.

A charge transfer method performed by the horizontal transfer register 11 will be described next. FIG. 3 illustrates potentials formed by the horizontal transfer register 11 when the voltage is not applied to the transfer electrode 17. As illustrated in FIG. 3, when the voltage is not applied to the transfer electrode 17, a potential 24-1 formed by the transfer barrier portion 18 is formed so as to be deeper than a potential 24-2 formed by the channel region 13.

Because the potentials 24-1 and 24-2 are formed, a charge 25 exists in the channel region 13 whose potential is deep.

Figure 4:
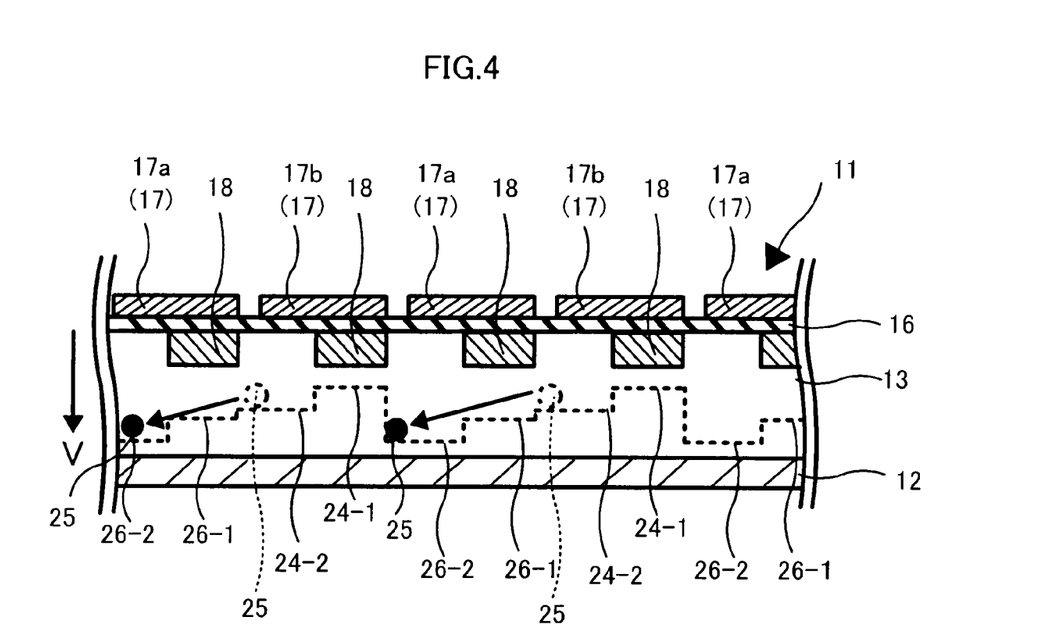
FIG. 4 illustrates potentials formed by the channel layer and the transfer barrier portion when the voltage is applied to the solid-state imaging device of FIG. 2.

FIG. 4 illustrates potentials formed by the horizontal transfer register 11 when the voltage is applied to the transfer electrode 17. As illustrated in FIG. 4, when the voltage is applied to a plurality of transfer electrodes 17a that are alternately located, the potentials formed by the channel region 13 and the transfer barrier portion 18 below the transfer electrode 17a are deepened. That is, potentials 26-1 and 26-2 that are formed by the channel region 13 and the transfer barrier portion 18 below the transfer electrode 17a to which the voltage is applied become deeper than the potentials 24-1 and 24-2 that are formed by the channel region 13 and the transfer barrier portion 18 below a transfer electrode 17b to which the voltage is not applied. Accordingly, the charge 25 (indicated by a dotted line in FIG. 4) existing in the channel region 13 below the transfer electrode 17b is transferred in a direction toward a part in which the potential is deeper (a direction of arrows in FIG. 4). That is, the charge 25 existing in the channel region 13 below the transfer electrode 17b is transferred to the channel region 13 below the transfer electrode 17a through the transfer barrier portion 18 below the transfer electrode 17a.

Then, the voltage is applied to a plurality of transfer electrodes 17b that are alternately located. As a result, as described above, the charge 25 existing in the channel region 13 below the transfer electrode 17a is transferred to the channel region 13 below the transfer electrode 17b. The vertical transfer register 11 transfers the charge 25 by repeating this process.

Figure 5:
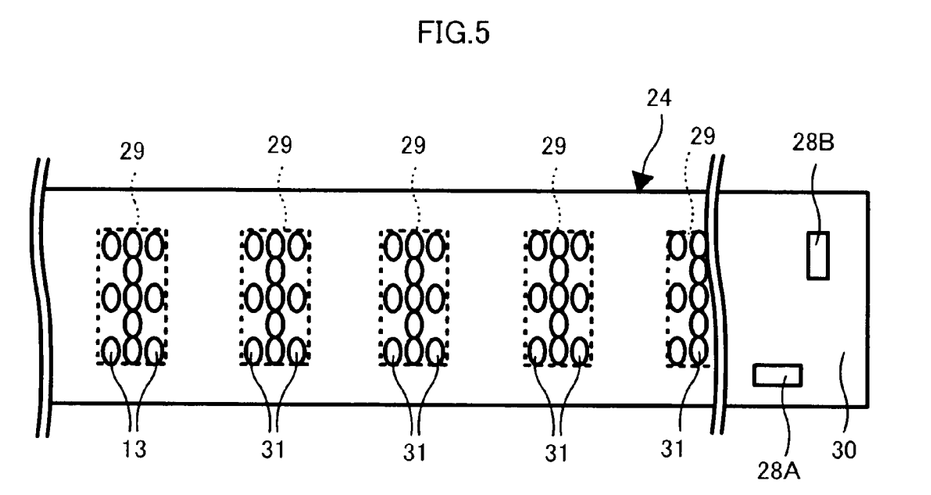
FIG. 5 is a plan view of a grating mask.

The solid-state imaging device producing method will be described next. First, a grating mask 27 used in the producing method will be described. The grating mask 27 has a first region and a second region. The first region is formed on a transparent resin substrate, and light is completely transmitted through the first region. The second region is formed on the transparent resin substrate, and a smaller quantity of light than light transmitted through the first region is transmitted through the second region. The grating mask 27 will be described in detail below with reference to FIG. 5. FIG. 5 is a plan view illustrating the grating mask 27 used in the solid-state imaging device producing method.

As illustrated in FIG. 5, in the grating mask 27, two rectangular opening patterns 28A and 28B are provided as the first region, and dot pattern regions 29 are provided as the second region.

The two opening patterns 28A and 28B are formed by removing a light-blocking chromium film 30 on a glass substrate that is the transparent resin substrate into rectangular shapes. Accordingly, the light with which the grating mask 27 is irradiated is completely transmitted through the opening patterns 28A and 28B.

The dot pattern region 29 is a set of a plurality of micro openings 31 formed by removing the chromium film 30 into elliptical shapes. Accordingly, the light with which the grating mask 27 is irradiated is partially transmitted through the dot pattern region 29.

The chromium film 30 is appropriately removed based on design data of the mask.

Specifically, the grating mask 27 is designed such that the opening patterns 28A and 28B have high light transmittance, and the dot pattern region 29 has low light transmittance. The light transmittance of the dot pattern region 29 can be controlled by a size, arrangement, and density of the micro openings 31.

The solid-state imaging device producing method in which the grating mask 27 of FIG. 5 is used will be described next. The solid-state imaging device producing method according to an embodiment of the invention includes a process of applying a resist material 33, a process of forming a resist layer 32 having openings 34A and 34B and thin-film portions 35, a process of forming the impurity region, a process of forming the alignment marks 15A and 15B after the formation of the impurity, and a process of forming the electrode 17. In the process of applying the resist material 33, the resist material 33 is applied onto the substrate 12 in which the channel region 13 is formed. In the process of forming the resist layer 32 having the openings 34A and 34B and the thin-film portions 35, the resist material 33 is exposed and developed using the mask 27 having the first region through which the light is transmitted and the second region through which a smaller quantity of light than light transmitted through the first region is transmitted, thereby forming the resist layer 32 having the openings 34A and 34B and the thin-film portions 35. In the process of forming the impurity region, using the resist layer 32 having the openings 34A and 34B and the thin-film portions 35 as a mask, the substrate 12 is subjected to ion implantation to form the impurity region. In the process of forming the alignment marks 15A and 15B, after the ion implantation process, the substrate 12 is etched using the resist layer 32 having the openings 34A and 34B and the thin-film portions 35 as the mask to form the alignment marks 15A and 15B. In the process of forming the electrode 17, the electrode 17 is formed on the impurity region and part of the channel region 13 using the alignment marks 15A and 15B as references. The solid-state imaging device producing method will be described more specifically with reference to FIGS. 6 to 12. FIGS. 6 to 12 are sectional views of the solid-state imaging device taken along a dashed and dotted line A-A' of FIG. 1 for explaining producing processes of the device.

Figure 6:
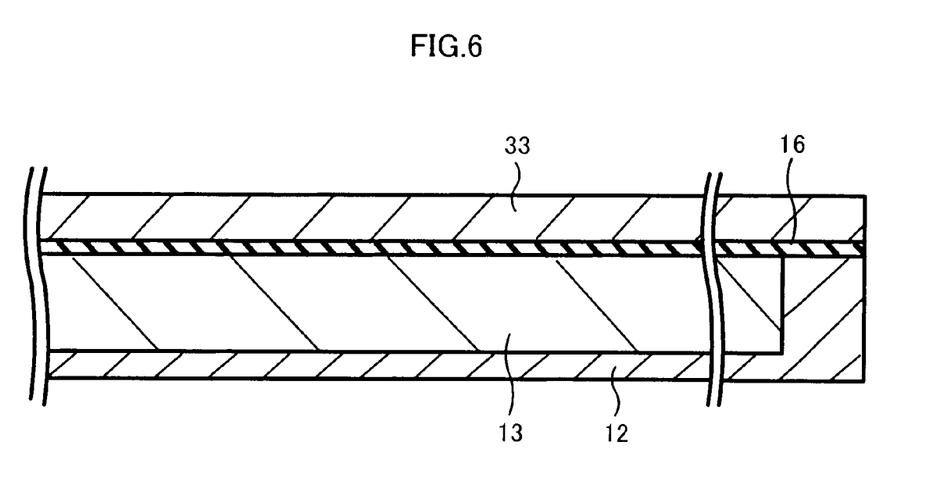
FIG. 6 is a view for explaining the solid-state imaging device producing method according to the embodiment of the invention that corresponds to FIG. 2 and illustrates a process of applying a resist material onto a substrate.
Figure 7:
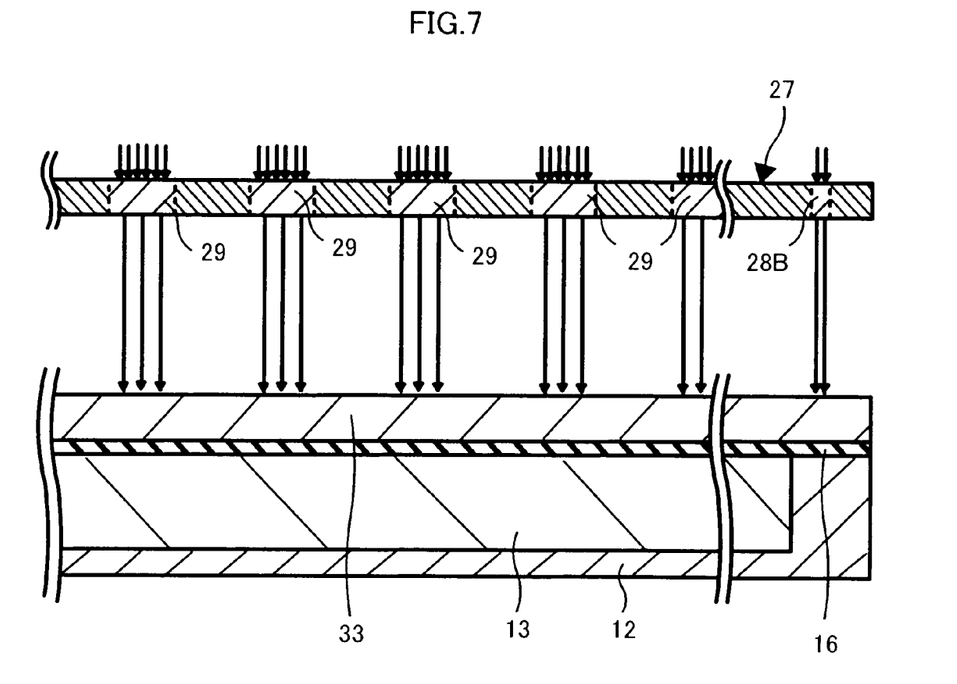
FIG. 7 is a view for explaining the solid-state imaging device producing method according to the embodiment of the invention that corresponds to FIG. 2 and illustrates a process of exposing the resist material.
Figure 8:
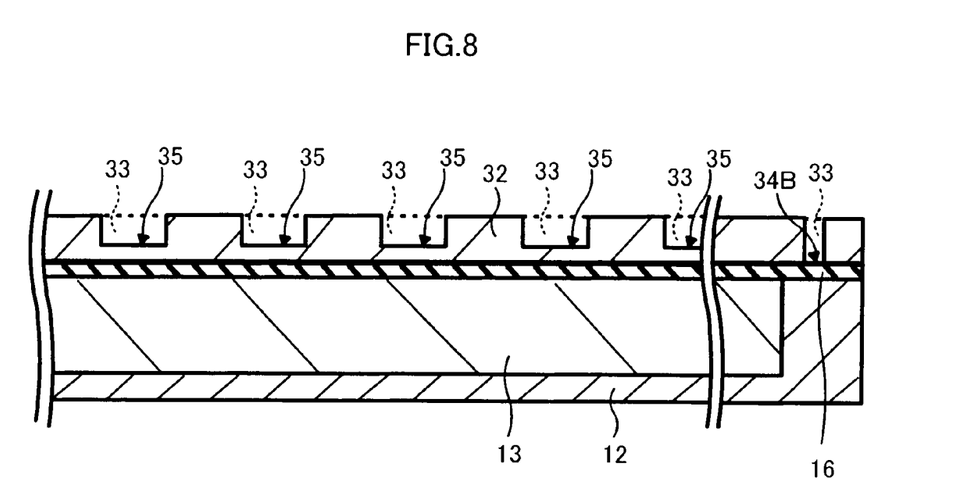
FIG. 8 is a view for explaining the solid-state imaging device producing method according to the embodiment of the invention that corresponds to FIG. 2 and illustrates a process of developing the resist material.
Figure 9:
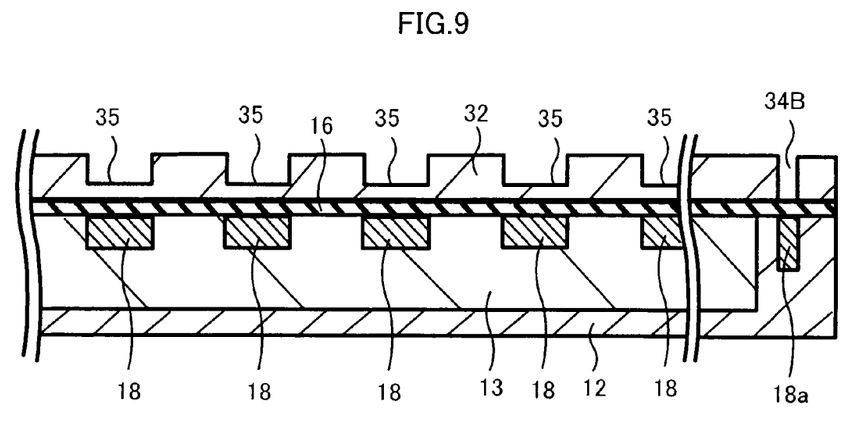
FIG. 9 is a view for explaining the solid-state imaging device producing method according to the embodiment of the invention that corresponds to FIG. 2 and illustrates a process of forming the transfer barrier portion.
Figure 10:
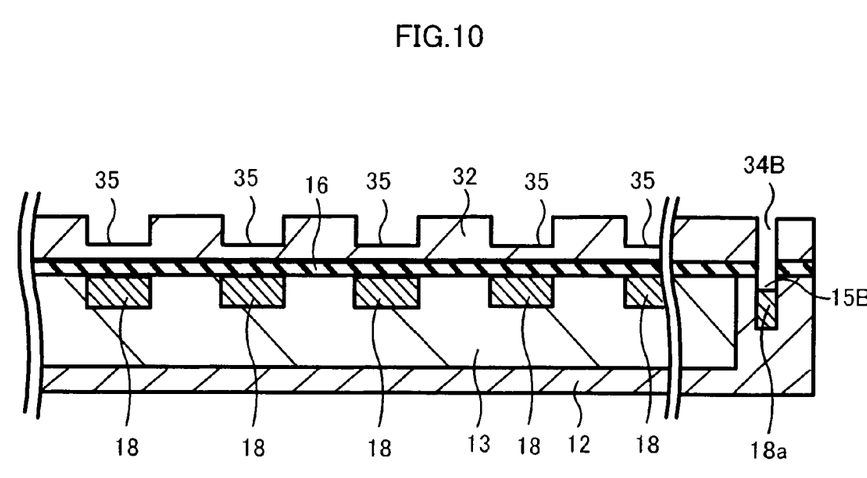
FIG. 10 is a view for explaining the solid-state imaging device producing method according to the embodiment of the invention that corresponds to FIG. 2 and illustrates a process of forming an alignment mark.

First, as illustrated in FIGS. 6 to 8, using the grating mask 27, the resist layer 32 for use in forming the alignment marks 15A and 15B and the transfer barrier portions 18 is formed. Then, as illustrated in FIG. 9, ion implantation is performed through the resist layer 32. Subsequently, as illustrated in FIG. 10, etching is performed in order to form the alignment marks 15A and 15B. According to the solid-state imaging device producing method of the embodiment, the alignment marks 15A and 15B formed through the above-described processes are used as positional references in forming the transfer electrodes 17, which allows the transfer electrodes 17 to be formed accurately in desired positions. As illustrated in FIGS. 9 and 10, in the solid-state imaging device producing method of the embodiment, the silicon substrate 12 is subjected to the ion implantation through the resist layer 32 before the resist layer 32 is etched, so that the transfer barrier portions 18 can be formed to have an accurate depth. The method will be described in detail below.

First, a method for forming the resist layer 32 for use in forming the alignment marks 15A and 15B and the transfer barrier portions 18 will be described with reference to FIGS. 6 and 8.

As illustrated in FIG. 6, the resist material 33 is applied to the whole surface of the silicon substrate 12 in which and on which the channel region 13 and the first oxide film 16 are formed. For example, one of phosphorous (P) and arsenic (As) is implanted to form the channel region 13.

Then, as illustrated in FIG. 7, the resist material 33 is exposed through the grating mask 27 of FIG. 5. At this point, the resist material 33 immediately below the opening pattern 28B is irradiated with a large quantity of light. On the other hand, the resist material 33 immediately below the dot pattern regions 29 is irradiated with a smaller quantity of light than the light with which the resist material 33 immediately below the opening pattern 28B is irradiated. Although not illustrated, the resist material 33 immediately below the opening pattern 28A is also irradiated with a large quantity of light.

Next, the resist material 33 exposed through the grating mask 27 is developed as illustrated in FIG. 8. Thus, the resist layer 32 having the openings 34A and 34B (opening 34A is not illustrated) for forming the alignment marks 15A and 15B and the thin-film portions 35 for forming the transfer barrier portions 18 is formed by performing exposure and development only once.

That is, because of a large amount of exposure of the resist material 33 immediately below the opening pattern 34B, the resist material 33 is completely removed by the development. Similarly, although not illustrated, because of a large amount of exposure of the resist material 33 immediately below the opening pattern 34A, the resist material 33 is also completely removed by the development. Thus, the openings 34A and 34B are formed. On the other hand, because of a small amount of exposure of the resist material 33 immediately below the dot pattern regions 29, part of the resist material 33 remains by the development. Thus, the thin-film portions 35 are formed.

The solid-state imaging device producing method in which the resist layer 29 is used as the mask will be described next with reference to FIGS. 9 to 12.

First, as illustrated in FIG. 9, boron (B), for example, is ion-implanted in the silicon substrate 12 using the resist layer 29 formed on the silicon substrate 12 as the mask. The transfer barrier portions 18 that are impurity layers having a desired depth are formed through an annealing process that is a heat treatment.

The transfer barrier portions 18 are formed to have a desired depth by considering and appropriately adjusting ion implantation energy, a thickness of the thin-film portions 35, and a thickness of the first oxide film 16. In the embodiment, because the etching process is not performed yet at this point, a designed thickness of the thin-film portions 35 is maintained. Accordingly, the transfer barrier portions 18 having the desired depth is formed.

When the transfer barrier portions 18 are formed, the impurity regions 18a are also formed through the openings 34A and 34B (opening 34A is not illustrated) of the resist layer 32 in positions where the alignment marks 15A and 15B are formed.

Next, as illustrated in FIG. 10, the silicon substrate 12 is subjected to the dry etching using the resist layer 32 used in the ion implantation process as the mask. Thus, the first oxide film 16 immediately below the openings 34A and 34B (opening 34A is not illustrated) and part of the silicon substrate 12 are removed into a recess shape, thereby forming the alignment marks 15A and 15B (alignment mark 15A is not illustrated).

The resist layer 32 is also etched in the dry etching process. Accordingly, it is necessary to finish the dry etching process at least before the thin-film portion 35 of the resist layer 32 is completely removed.

Figure 11:
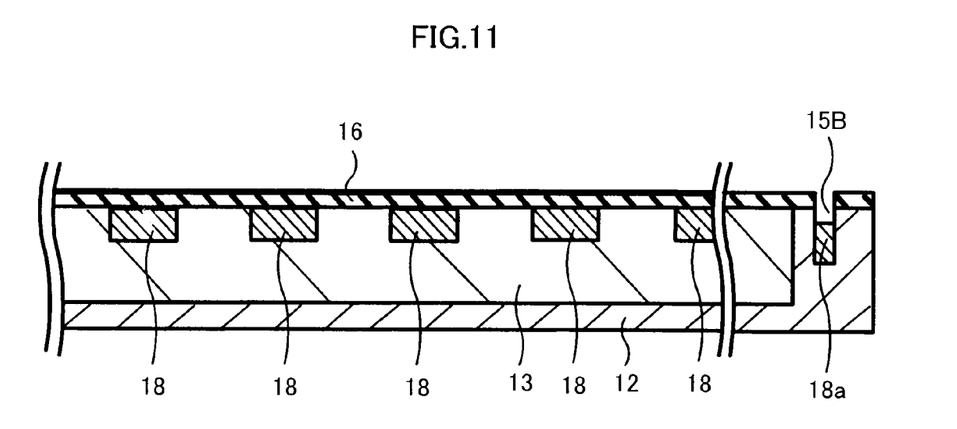
FIG. 11 is a view for explaining the solid-state imaging device producing method according to the embodiment of the invention that corresponds to FIG. 2 and illustrates a process of removing a resist layer.

Then, as illustrated in FIG. 11, the resist layer 32 is removed from above the silicon substrate 12 by ashing, for example.

Figure 12:
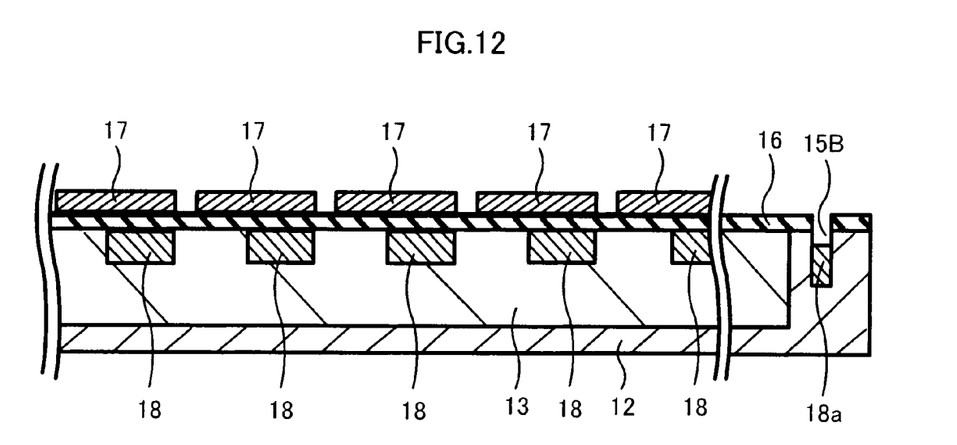
FIG. 12 is a view for explaining the solid-state imaging device producing method according to the embodiment of the invention that corresponds to FIG. 2 and illustrates a process of forming a transfer electrode.

Finally, as illustrated in FIG. 12, the transfer electrodes 17 are formed on the transfer barrier portions 18 and parts of the channel region 13 by using the alignment marks 15A and 15B (alignment mark 15A is not illustrated) as references for alignment. Specifically, a resist material for electrode formation is applied onto the silicon substrate 12 from which the resist layer 32 is removed. Then, openings for electrode formation are formed in the resist material. The openings are formed in positions that are designed using the alignment marks 15A and 15B as references. Accordingly, the openings for electrode formation are accurately formed in desired positions. Then, the polysilicon film is formed by a CVD method, for example, through the resist layer having the openings that are accurately formed in the desired positions. Subsequently, the transfer electrodes 17 are formed by removing the resist layer.

After the transfer electrodes 17 are formed as described above, the second oxide film 19, the first interconnection layer 20, the third oxide film 21, the second interconnection layer 22, and the passivation film 23 are sequentially formed on the silicon substrate 12 in which the transfer electrodes 17 are formed using the positions of the transfer electrodes 17 as references. Thus, the solid-state imaging device illustrated in FIGS. 1 and 2 is produced.

As described above, according to the solid-state imaging device producing method according to the embodiment of the invention, the transfer electrodes 17 can accurately be formed in the desired positions by using the alignment marks 15A and 15B as references.

In the solid-state imaging device producing method according to the embodiment of the invention, the etching to form the alignment marks 15A and 15B is performed after the ion implantation to form the transfer barrier portions 18 is performed. Therefore, the thickness of the thin-film portions 35 of the resist layer 33 does not become smaller than the desired thickness at the time of the ion implantation. As a result, the transfer barrier portions 18 can accurately be formed to have the desired depth. Accordingly, the charge transfer efficiency can be improved in the solid-state imaging device produced by the solid-state imaging device producing method according to the embodiment of the invention.

The solid-state imaging device producing method according to the embodiment has been described above. Although the method for producing the horizontal transfer register 11 has been described in the above description, the solid-state imaging device producing method according to the embodiment of the invention is not limited to the method for producing the horizontal transfer register 11. For example, the solid-state imaging device producing method of the invention can also be applied to the method for forming the vertical transfer register.

The alignment marks 15A and 15B are not limited to the above-described shapes. For example, a cross shape or an L-shape may be used as the shapes of the alignment marks 15A and 15B. The alignment marks 15A and 15B are not limited to the above-described positions and numbers. The invention can also be applied to a case where required numbers of alignment marks 15A and 15B are formed in required positions.

In the embodiment, the dot pattern regions 29 included in the grating mask 27 are the sets of a plurality of micro openings 31 that are formed by removing the chromium film 30 into the elliptical shapes. The micro openings 31 constituting the dot pattern regions 29 are not limited to the arrangement, density, and shapes as illustrated in FIG. 3.

The grating mask 27 is not limited to one which is formed by removing the chromium film 30 on the glass substrate. For example, the grating mask 27 may be obtained by forming the light-blocking chromium film into the dotted shape on the glass substrate. In this case, the light transmittance can be controlled by the area and density of the dotted chromium film. That is, the light transmittance can be reduced, as the area and density of the dotted chromium film are increased.

In the invention, it is assumed that the mask or the exposure mask includes not only the mask itself such as the grating mask 27, but also the design data for producing such grating mask 27.

Although the solid-state imaging device is the single-layer electrode structure in the embodiment, the invention can also be applied to the method for producing a solid-state imaging device having a multi-layer electrode structure.

Further, the invention can be applied to a semiconductor device producing method including at least a process of forming an impurity region in a substrate by ion implantation and a process of forming another element by overlaying the element on the impurity region formed by the impurity region forming process.

While certain embodiments have been described, these embodiments have been presented by way of example only, and are not intended to limit the scope of the inventions. Indeed, the novel methods and exposure mask described herein may be embodied in a variety of other forms; furthermore, various omissions, substitutions and changes in the form of the methods and exposure mask described herein may be made without departing from the spirit of the inventions. The accompanying claims and their equivalents are intended to cover such forms or modifications as would fall within the scope and spirit of the inventions.

What is claimed is:

1. A solid-state imaging device producing method comprising the steps of:

applying a resist material onto a substrate in which a channel region is formed;

forming a resist layer by exposure and development of the resist material using a mask, the resist layer having an opening and a thin-film portion, the mask having a first region through which light is transmitted and a second region through which a smaller quantity of light than that the light transmitted through the first region is transmitted;

subjecting the substrate to ion implantation using the resist layer as a mask to form an impurity region;

etching the substrate using the resist layer as a mask after the ion implantation to form an alignment mark; and forming an electrode on the impurity region and part of the channel region using the alignment mark as a reference.

2. The solid-state imaging device producing method according to claim 1, wherein the resist material is exposed such that an amount of exposure is large with respect to the resist material immediately below the first region formed in the mask while an amount of exposure is smaller with respect to the resist material immediately below the second region formed in the mask than that with respect to the resist material immediately below the first region.

3. The solid-state imaging device producing method according to claim 1, wherein the second region is a region where the thin-film portion of the resist material is formed.

4. The solid-state imaging device producing method according to claim 3, wherein the impurity region is a region formed by subjecting the substrate to ion implantation through the thin-film portion.

5. The solid-state imaging device producing method according to claim 1, wherein the first region is a region where the opening of the resist material is formed.

6. The solid-state imaging device producing method according to claim 5, wherein the alignment mark is a mark formed by etching the substrate through the opening.

7. The solid-state imaging device producing method according to claim 1, wherein the second region is a region formed by partially removing a light-blocking film on a transparent resin substrate.

8. The solid-state imaging device producing method according to claim 1, wherein the second region is a region having a plurality of micro openings that are formed by removing a light-blocking film on a transparent resin substrate.

9. The solid-state imaging device producing method according to claim 8, wherein the micro opening has an elliptical shape.

10. The solid-state imaging device producing method according to claim 1, wherein the first region is a region formed by removing a light-blocking film on a transparent resin substrate.

11. The solid-state imaging device producing method according to claim 10, wherein the first region is a region formed by the light-blocking film on the transparent resin substrate into a rectangular shape.

12. The solid-state imaging device producing method according to claim 1, wherein a plurality of first regions are formed with a space between one another.

* * * * *